US006711703B2

(12) United States Patent
MacLaren et al.

(10) Patent No.: US 6,711,703 B2
(45) Date of Patent: Mar. 23, 2004

(54) HARD/SOFT ERROR DETECTION

(75) Inventors: John M. MacLaren, Cypress, TX (US); Tim Majni, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 149 days.

(21) Appl. No.: 09/966,891

(22) Filed: Sep. 28, 2001

(65) Prior Publication Data

US 2002/0016942 A1 Feb. 7, 2002

Related U.S. Application Data

(63) Continuation of application No. 09/769,958, filed on Jan. 25, 2001.
(60) Provisional application No. 60/178,108, filed on Jan. 26, 2000.

(51) Int. Cl.[7] .......................... G11C 29/00; G06F 11/08
(52) U.S. Cl. ..................... 714/704; 714/718; 714/763
(58) Field of Search ............................. 714/704, 718, 714/763

(56) References Cited

U.S. PATENT DOCUMENTS

| 4,209,846 | A | * | 6/1980 | Seppa ........................ 714/52 |
| 4,255,808 | A | * | 3/1981 | Schaber ..................... 714/764 |
| 4,970,718 | A | * | 11/1990 | Simcoe et al. ............. 370/434 |
| 5,313,626 | A |   | 5/1994 | Jones et al. ................ 395/575 |
| 5,331,646 | A |   | 7/1994 | Krueger et al. ........... 371/40.1 |
| 5,367,669 | A |   | 11/1994 | Holland et al. ............ 395/575 |
| 6,067,649 | A | * | 5/2000 | Goodwin .................... 714/718 |
| 6,098,132 | A |   | 8/2000 | Olarig et al. .............. 710/103 |
| 6,157,201 | A | * | 12/2000 | Leung ........................ 324/760 |
| 6,223,301 | B1 |  | 4/2001 | Santeler et al. ............... 714/6 |

FOREIGN PATENT DOCUMENTS

| US | 20010044917 A1 | * | 11/2001 | ........... G11C/29/00 |
| US | 20010047497 A1 | * | 11/2001 | ........... G06F/11/30 |

OTHER PUBLICATIONS

Hardware Mechanism to Determine the Type of Single Bit Memory Error, IBM Technical disclosure Bulletin, vol. 32, No. 4B, Sep., 1989, p. 241.*
Detection of Temporary Single Data Bit Memory Errors, IBM Technical Disclosure Bulletin, vol. 36, No. 12, Dec. 1993, pp 29–32.*
Programmable Single Bit Error Counter for Computer Error Checking And Correction Facilities, IBM Technical Disclosure Bulletin, vol. 33, No. 12, May 1991.*

* cited by examiner

Primary Examiner—R. Stephen Dildine

(57) ABSTRACT

A system and technique for detecting and classifying data errors in a memory device. More specifically, data errors in a memory device are detected by a host controller. The error is classified as a hard error or a soft error. If the error is classified as a hard error, a tracking device is implemented to track the number of hard errors detected in the system. Once a pre-determined number of hard errors are detected in a particular memory segment, an indicator, such as a light emitting diode (LED), may be used to indicate the corresponding memory segment should be replaced.

25 Claims, 6 Drawing Sheets

HARD/SOFT ERROR DETECTION

CROSS-REFERENCE TO RELATED APPLICATION

The present application is a continuation of application No. 09/769,958 filed on Jan. 25, 2001 which claims priority under 35 U.S.C §119(e) to provisional application Ser. No. 60/178,108 filed on Jan. 26, 2000.

BACKGROUND OF THE INVENTION

1. Field of the Invention

The present invention relates generally to memory protection, and more specifically to a technique for detecting errors in a memory device.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Semiconductor memory devices used in computer systems, such as dynamic random access memory (DRAM) devices, generally comprise a large number of capacitors which store binary data in each memory device in the form of a charge. These capacitors are inherently susceptible to errors. As memory devices get smaller and smaller, the capacitors used to store the charges also become smaller thereby providing a greater potential for errors.

Memory errors are generally classified as "hard errors" or "soft errors." Hard errors are generally caused by issues such as poor solder joints, connector errors, and faulty capacitors in the memory device. Hard errors are reoccurring errors which generally require some type of hardware correction such as replacement of a connector or memory device. Soft errors, which cause the vast majority of errors in semiconductor memory, are transient events wherein extraneous charged particles cause a change in the charge stored in one of the capacitors in the memory device. When a charged particle, such as those present in cosmic rays, comes in contact with the memory circuit, the particle may change the charge of one or more memory cells, without actually damaging the device. Because these soft errors are transient events, generally caused by alpha particles or cosmic rays for example, the errors are not generally repeatable and are generally related to erroneous charge storage rather than hardware errors. For this reason, soft errors, if detected, may be corrected by rewriting the erroneous memory cell with correct data. Uncorrected soft errors will generally result in unnecessary system failures. Further, soft errors may be mistaken for more serious system errors and may lead to the unnecessary replacement of a memory device. By identifying soft errors in a memory device, the number of memory devices which are actually physically error free and are replaced due to mistaken error detection can be mitigated, and the errors may be easily corrected before any system failures occur.

Memory errors can be categorized as either single-bit or multi-bit errors. A single bit error refers to an error in a single memory cell. Single-bit errors can be detected and corrected by standard Error Code Correction (ECC) methods. However, in the case of multi-bit errors, which affect more than one bit, standard ECC methods may not be sufficient. In some instances, ECC methods may be able to detect multi-bit errors, but not correct them. In other instances, ECC methods may not even be sufficient to detect the error. Thus, multi-bit errors must be detected and corrected by a more complex means since a system failure will typically result if the multi-bit errors are not detected and corrected.

Regardless of the classification of memory error (hard/soft, single-bit/multi-bit), the current techniques for detecting the memory errors have several drawbacks. Typical error detection techniques rely on READ commands being issued by requesting devices, such as a peripheral disk drive. Once a READ command is issued to a memory sector, a copy of the data is read from the memory sector and tested for errors en route to delivery to the requesting device. Because the testing of the data in a memory sector only occurs if a READ command is issued to that sector, seldom accessed sectors may remain untested indefinitely. Harmless single-bit errors may align over time resulting in uncorrectable multi-bit errors. Once a READ request is finally issued to a seldom accessed sector, previously correctable errors may have evolved into uncorrectable errors thereby causing unnecessary data corruption or system failures. Early error detection may significantly reduce the occurrences of uncorrectable errors and prevent future system failures.

Further, in redundant memory systems, undetected memory errors may pose an additional threat. Certain operations, such as hot-plug events, may require that the system transition from a redundant to a non-redundant state. In a non-redundant state, memory errors which were of little concern during a redundant mode of operation, may become more significant since errors that were correctable during a redundant mode of operation may no longer be correctable while the system operates in a non-redundant state.

The present invention may address one or more of the concerns set forth above.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
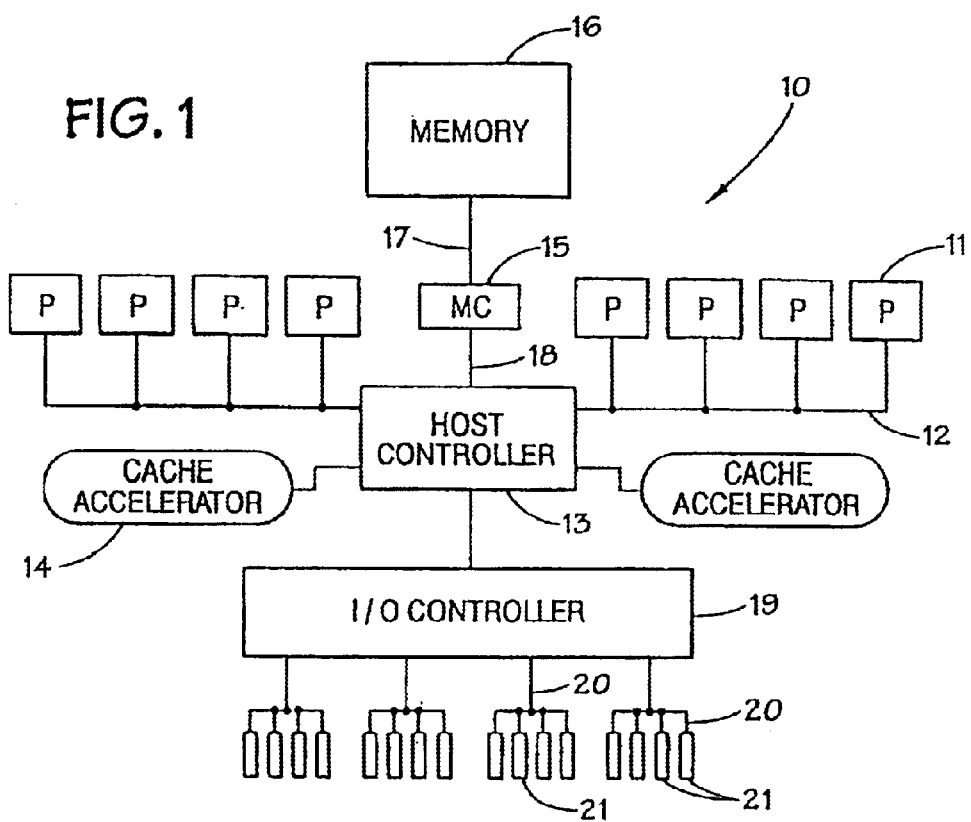
FIG. 1 is a block diagram illustrating an exemplary computer system.

Turning now to the drawings, and referring initially to FIG. 1, a multiprocessor computer system, for example a Proliant 8500 PCI-X from Compaq Computer Corporation, is illustrated and designated by the reference numeral 10. In this embodiment of the system 10, multiple processors 11 control many of the functions of the system 10. The processors 11 may be, for example, Pentium, Pentium Pro, Pentium II Xeon (Slot-2), or Pentium III processors available from Intel Corporation. However, it should be understood that the number and type of processors are not critical to the technique described herein and are merely being provided by way of example.

Typically, the processors 11 are coupled to a processor bus 12. As instructions are sent and received by the processors 11, the processor bus 12 transmits the instructions and data between the individual processors 11 and a host controller 13. The host controller 13 serves as an interface directing signals between the processors 11, cache accelerators 14, a memory controller 15 (which may be comprised of one or more memory control devices as discussed with reference to FIGS. 5 and 6), and an I/O controller 19. Generally, ASICs are located within the host controller 13. The host controller 13 may include address and data buffers, as well as arbitration and bus master control logic. The host controller 13 may also include miscellaneous logic, such as error detection and correction logic. Furthermore, the ASICs in the host controller may also contain logic specifying ordering rules, buffer allocation, specifying transaction type, and logic for receiving and delivering data. When the data is retrieved from the memory 16, the instructions are sent from the memory controller 15 via a memory bus 17. The memory controller 15 may comprise one or more suitable standard memory control devices or ASICs.

The memory 16 in the system 10 is generally divided into groups of bytes called cache lines. Bytes in a cache line may comprise several variable values. Cache lines in the memory 16 are moved to a cache for use by the processors 11 when the processors 11 request data stored in that particular cache line.

The host controller 13 is coupled to the memory controller 15 via a memory network bus 18. As mentioned above, the host controller 13 directs data to and from the processors 11 through the processor bus 12, to and from the memory controller 15 through the network memory bus 18, and to and from the cache accelerator 14. In addition, data may be sent to and from the I/O controller 19 for use by other systems or external devices. The I/O controller 19 may comprise a plurality of PCI-bridges, for example, and may include counters and timers as conventionally present in personal computer systems, an interrupt controller for both the memory network and I/O buses, and power management logic. Further, the I/O controller 19 is coupled to multiple I/O buses 20. Finally, each I/O bus 20 terminates at a series of slots or I/O interface 21.

Generally, a transaction is initiated by a requester, e.g., a peripheral device, via the I/O interface 21. The transaction is then sent to one of the I/O buses 20 depending on the peripheral device utilized and the location of the I/O interface 21. The transaction is then directed towards the I/O controller 19. Logic devices within the I/O controller 19 generally allocate a buffer where data returned from the memory 16 may be stored. Once the buffer is allocated, the transaction request is directed towards the processor 11 and then to the memory 16. Once the requested data is returned from the memory 16, the data is stored within a buffer in the I/O controller 19. The logic devices within the I/O controller 19 operate to read and deliver the data to the requesting peripheral device such as a tape drive, CD-ROM device or other storage device.

Figure 2:
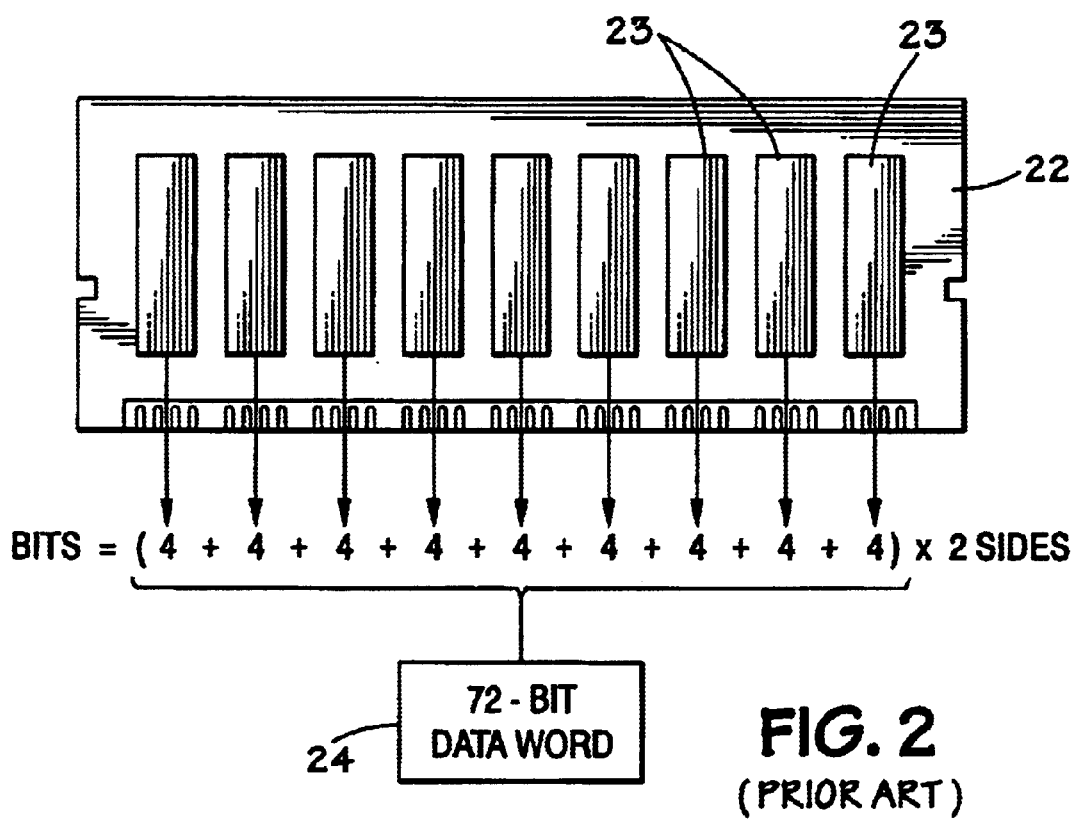
FIG. 2 illustrates an exemplary memory device used in the present system.

A system 10, such as a computer system, generally comprises a plurality of memory modules, such as Dual Inline Memory Modules (DIMMs). A standard DIMM may include a plurality of memory devices such as Dynamic Random Access Memory Devices (DRAMs). In an exemplary configuration, a DIMM may comprise nine memory devices on each side of the DIMM 22. FIG. 2 illustrates one side of a DIMM 22 which includes nine DRAMs 23. The second side of the DIMM 22 may be identical to the first side and may comprise nine additional DRAM devices (not shown). Each DIMM 22 access generally accesses all DRAMs 23 on the DIMM 22 to produce a data word. For example, a DIMM 22 comprising ×4 DRAMs 23 (DRAMs passing 4-bits with each access) will produce 72-bit data words. System memory is generally accessed by CPUs and I/O devices as a cache line of data. A cache line generally comprises several 72-bit data words. Thus, each DIMM 22 accessed on a single memory bus provides a cache line of 72-bit data words 24.

Each of the 72 bits in each of the data words 24 is susceptible to soft errors. Different methods of error detection may be used for different memory architectures. The present method and architecture incorporates a Redundant Array of Industry Standard DIMMs (RAID). As used herein, RAID memory refers to a "4+1 scheme" in which a parity word is created using an XOR module such that any one of the four data words can be re-created using the parity word if an error is detected in one of the data words. Similarly, if an error is detected in the parity word, the parity word can be re-created using the four data words. By using the present RAID memory architecture, not only can multi-bit errors be easily detected and corrected, but it also provides a system in which the memory module alone or the memory module and associated memory controller can be removed and/or replaced while the system is running (i.e. the memory modules and controllers are hot-pluggable).

Figure 3:
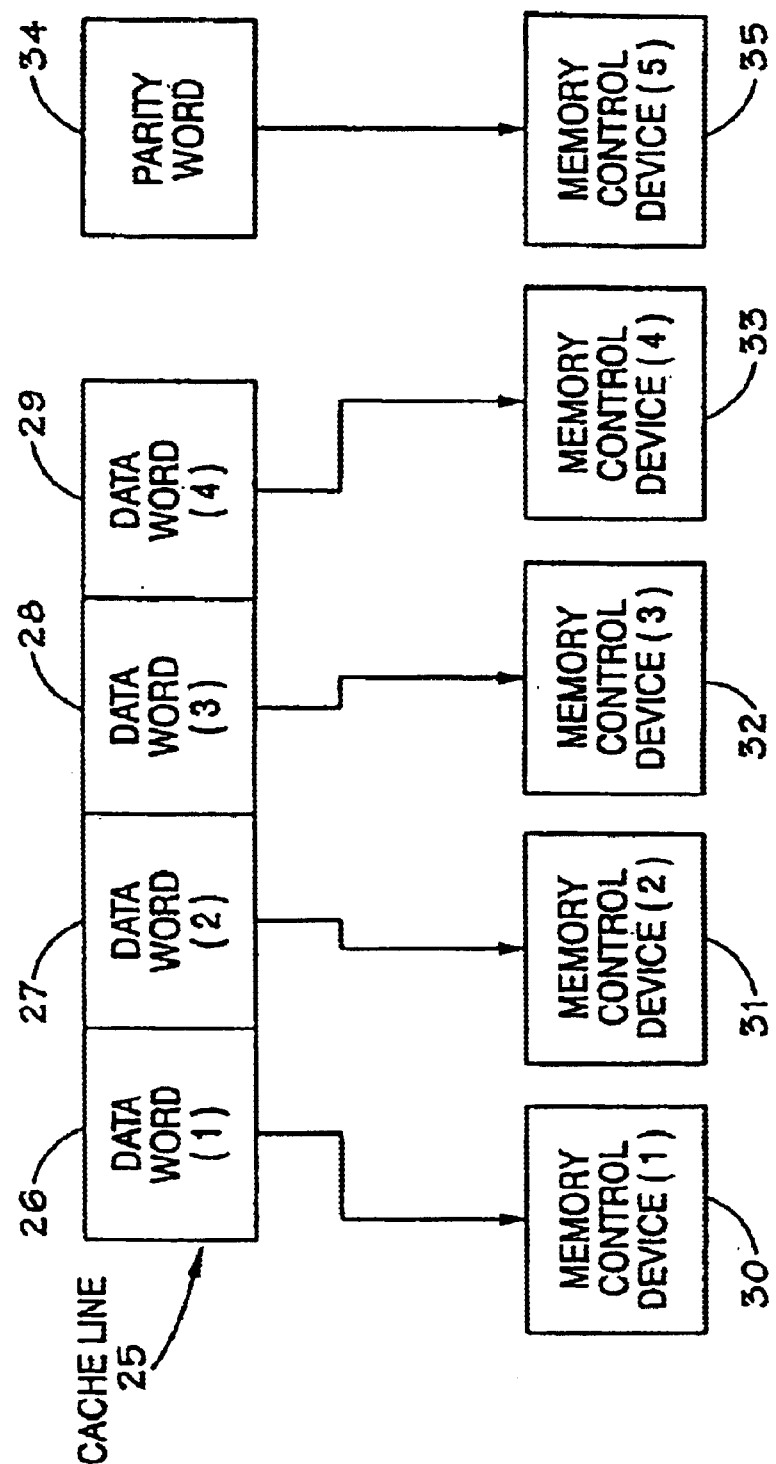
FIG. 3 generally illustrates a cache line and memory controller configuration in accordance with the present technique.

FIG. 3 illustrates one implementation of RAID memory. RAID memory stripes a cache line of data 25 such that each of the four 72-bit data words 26, 27, 28, and 29 is transmitted through a separate memory control device 30, 31, 32, and 33. A fifth parity data word 34 is generated from the original cache line 25. Each parity word 34 is also transmitted through a separate memory control device 35. The generation of the parity data word 34 from the original cache line 25 of data words 26, 27, 28, and 29 can be illustrated by way of example. For simplicity, four-bit data words are illustrated. However, it should be understood that these principals are applicable to 72-bit data words, as in the present system, or any other useful word lengths. Consider the following four data words:

DATA WORD 1: 1 0 1 1
DATA WORD 2: 0 0 1 0
DATA WORD 3: 1 0 0 1
DATA WORD 4: 0 1 1 1

A parity word can be either even or odd. To create an even parity word, common bits are simply added together. If the sum of the common bits is odd, a "1" is placed in the common bit location of the parity word. Conversely, if the sum of the bits is even, a zero is placed in the common bit location of the parity word. In the present example, the bits may be summed as follows:

DATA WORD 1: 1 0 1 1

DATA WORD 2: 0 0 1 0

DATA WORD 3: 1 0 0 1

DATA WORD 4: 0 1 1 1

Parity Word: 0 1 1 1

When summed with the four exemplary data words, the parity word 0111 will provide an even number of active bits (or "1's") in every common bit. This parity word can be used to re-create any of the data words (1–4) if a soft error is detected in one of the data words as further explained with reference to FIG. 4.

Figure 4:
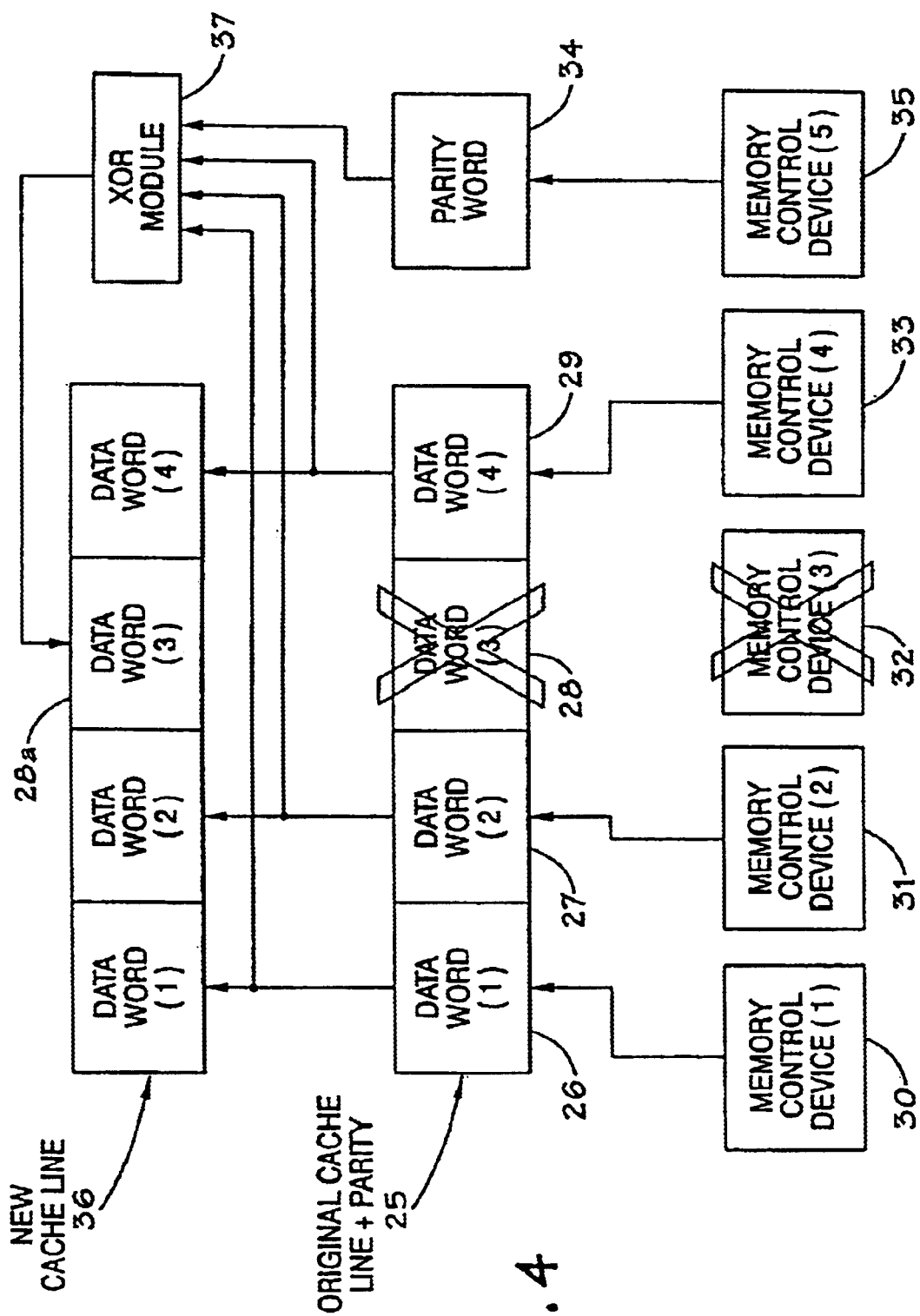
FIG. 4 generally illustrates the implementation of a RAID memory system to recreate erroneous data words.

FIG. 4 illustrates the re-creation of a data word in which a soft error has been detected in a RAID memory system. As in FIG. 3, the original cache line 25 comprises four data words 26, 27, 28, and 29 and a parity word 34. Further, the memory control device 30, 31, 32, 33, and 35 corresponding to each data word and parity word are illustrated. In this example, a data error has been detected in the data word 28. A new cache line 36 can be created using data words 26, 27, and 29 along with the parity word 34 using an exclusive-OR (XOR) module 37. By combining each data word 26, 27, 29 and the parity word 34 in the XOR module 37, the data word 28 can be re-created. The new and correct cache line 34 thus comprises data words 26, 27, and 29 copied directly from the original cache line 25 and data word 28a (which is the re-created data word 28) which is produced by the XOR module 37 using the error-free data words (26, 27, 29) and the parity word 34. It should also be clear that the same process may be used to re-create a parity word 34 if an error is detected therein using the four error-free data words.

Similarly, if the memory control device 32, which is associated with the data word 28, is removed during operation (i.e. hot-plugging) the data word 28 can similarly be re-created. Thus, any single memory control device can be removed while the system is running or any single memory control device can return a bad data word and the data can be re-created from the other four memory words using an XOR module.

Figure 5:
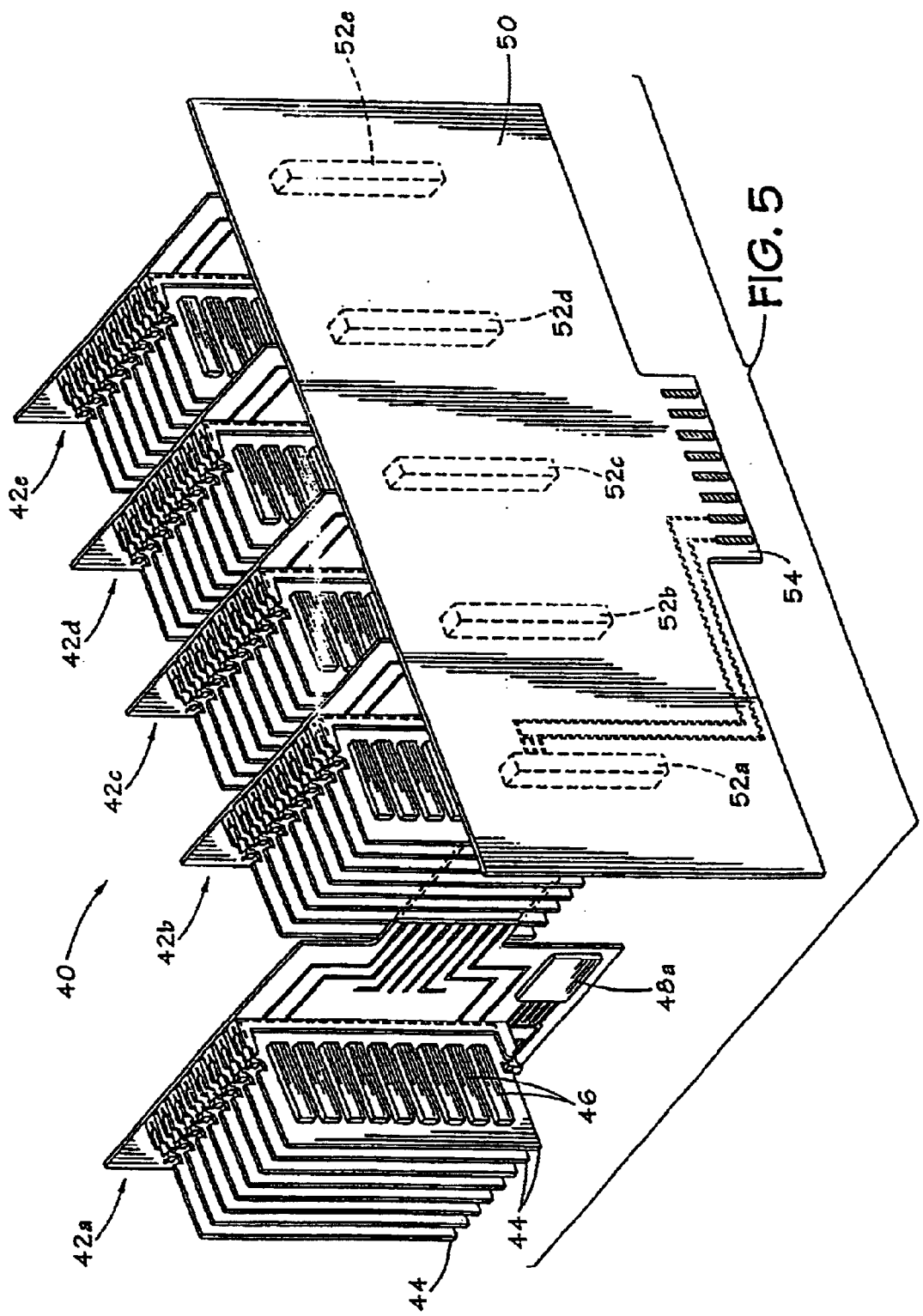
FIG. 5 illustrates an exemplary memory sub-system in accordance with the present technique.

FIG. 5 illustrates one embodiment of a memory subsystem 40, which incorporates a redundant (4+1) scheme. The memory sub-system 40 comprises five memory cartridges 42a–e. Memory cartridge 42e, for example, may be used for parity storage. The memory cartridge 42a includes eight DIMMs 44 mounted thereon. Each DIMM 44 includes nine memory devices, such as DRAMs 46 on each side of the DIMM substrate. (FIG. 5 illustrates only one side of the DIMM 44.) Further, the memory cartridge 42a has a memory control device 48a mounted thereon. It should be understood that each memory cartridge 42a–e includes a plurality of DIMMs 44 and a corresponding memory control device 48. The memory cartridges 42a–e may be mounted on a memory system board 50 via connectors 52a–e to create the memory sub-system 40. The memory sub-system 40 can be incorporated into a computer system via an edge connector 54 or by any suitable means of providing a data path from the computer system to the memory storage devices 46. It should be evident that each of the memory cartridges 42a–e may be removed (hot-plugged) from the memory sub-system 40. By removing a memory cartridge such as memory cartridge 42a from the memory sub-system 40, the computer system will transition from a redundant mode of operation (implementing the fifth memory cartridge) to a non-redundant state. When transitioning from a redundant to a non-redundant mode of operation during a hot-plug memory event, it may be advantageous to verify that no errors exist in the remaining memory cartridges 42b–e. Thus, immediately proceeding the removal of the memory cartridge 42a, a verify procedure may be advantageously implemented.

Further, a verify procedure may be advantageous in checking for memory errors in certain areas of memory which may sit idle for an extended period of time, allowing accumulation of errors or the growth of a single bit error to an uncorrectable multi-bit error. The verify procedure is implemented through a piece of logic which may reside in the memory sub-system 40. The verify logic can be programmed to verify a specific region of memory such as the contents of a single memory cartridge 42a–e or to verify the validity of the entire memory. The verify procedure relies on the normal ECC and error logging mechanisms to validate the health of the memory sub-system 40. The verify routine may be exercised by an operator instruction, as part of a sequence of memory operations (such as a hot-plug event), or based on a predetermined schedule. Simply put, the verify logic will read a defined memory region. If errors are detected they may be recorded and corrected, as further discussed below with reference to FIG. 6. Verify may then be executed again to validate that the correction mechanism in fact corrected the errors that were reported. The verify logic may reside in each memory controlled device 48a–e or on the memory system board 50.

Figure 6:
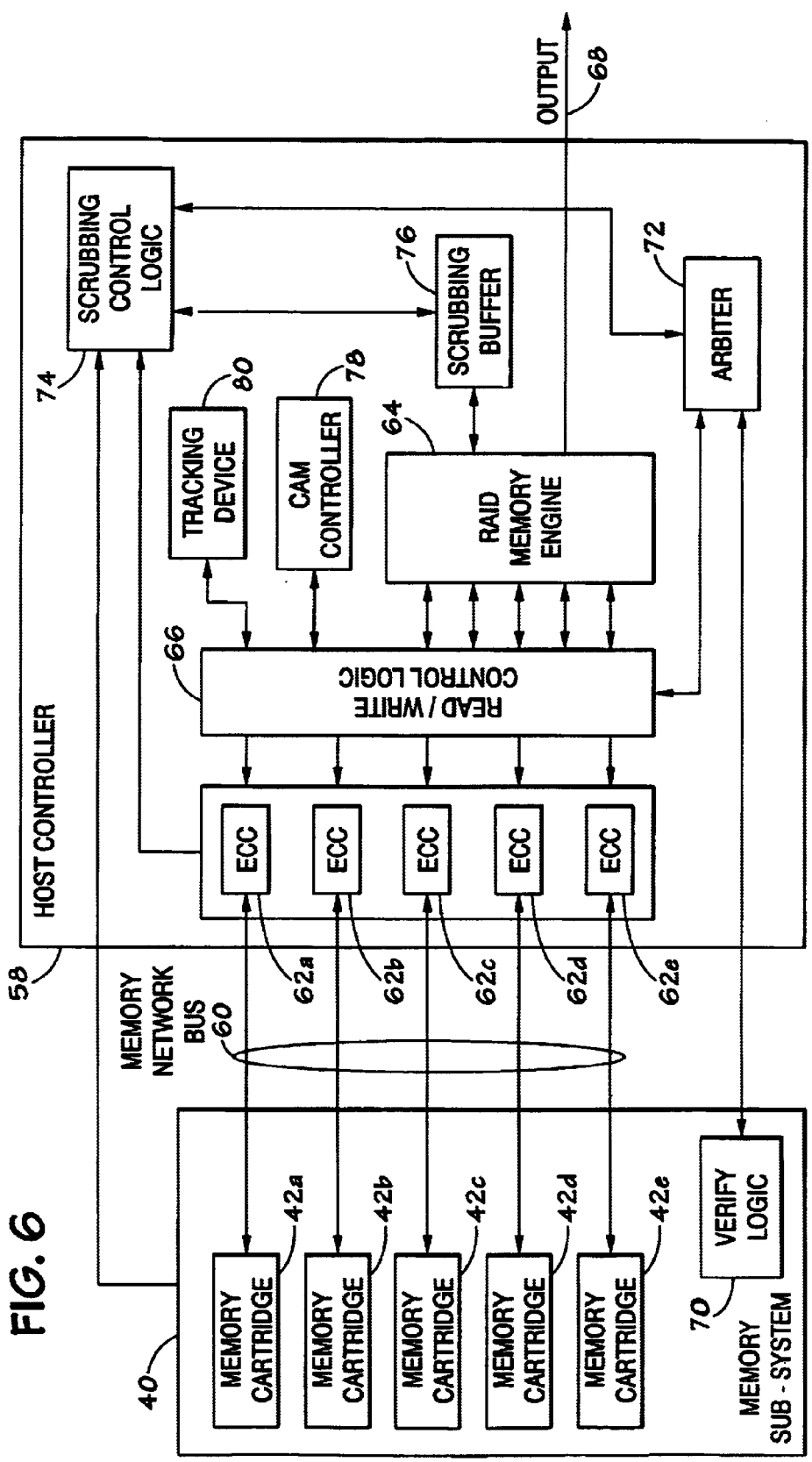
FIG. 6 is a block diagram illustrating an exemplary architecture associated with a computer system in accordance with the present technique.

FIG. 6 is a block diagram illustrating one embodiment of the verify technique which incorporates the RAID memory architecture. As previously described, a computer system includes a memory sub-system 40 comprising memory cartridges 42a–e. As described with reference to FIG. 5, each memory cartridge 42a–e may include a memory control device 48a–e (shown in FIG. 5). Thus, to access the memory devices 46 (shown in FIG. 5) in memory cartridge 42a, a READ command is issued and data is passed through the memory control device 48a, and so forth.

Each memory control device 48a–e may comprise ECC fault tolerance capability. As data is passed from the memory sub-system 40 to the host controller 58 via a memory network bus 60, each data word being produced by a memory cartridge 42a–e is checked for single bit memory errors in each respective memory control device 48a–e (residing on each respective memory cartridge 42a–e) by typical ECC methods. If no errors are detected, the data is simply passed to the host controller 58 and eventually to a requesting device via an OUTPUT 68. If a single-bit error is detected by a memory control device 48a–e, the data is corrected by the memory control device 48a–e. When the corrected data is sent to the host controller 58 via the memory network bus 60, error detection and correction devices 62a–e, which reside in the first controller 58 and may be identical to the ECC devices in the memory control devices 48a–e, will not detect any erroneous data words since the single-bit errors have been corrected by the memory control devices 48a–e in the memory sub-system 40. Therefore, if an error is detected and corrected by the memory control devices 48a–e, a message is sent from the memory control devices 48 are to the host controller 58 indicating that a memory error has been detected and corrected and that the corresponding memory cartridge 42a–e should be over-written with corrected data, as discussed in more detail below.

In an alternate embodiment, the error detection capabilities in the memory control devices 48a–e may be turned off or eliminated. Because the host controller 58 also includes error detection and correction devices 62a–e, any single bit errors can still be corrected using the standard ECC methods available in the host controller 58. Further, it is possible that errors may be injected while the data is on the memory network bus 60. In this instance, even if the error detection capabilities are turned on in the memory control devices 48a–e, the memory control devices 48a–e will not detect an error since the error is injected after the data has passed from the memory sub-system 40. Advantageously, since the host controller 58 includes similar or even identical error detection and correction devices 62a–e, the errors can be detected and corrected in the host controller 58.

If a multi-bit error is detected in one of the memory control devices 48a–e, the memory control device 48a–e, with standard ECC capabilities, can detect the errors but will not be able to correct the data error. Therefore, the erroneous data is passed to the error detection and correction devices 62a–e. Like the memory control devices 48a–e, the error detection and correction devices 62a–e, which also have typical ECC detection, can only detect but not correct the multi-bit errors. The erroneous data words may be passed to the RAID memory engine 64 via some READ/WRITE control logic 66, for correction.

In a typical memory READ operation, the host controller 58 will issue a READ command on the memory network bus 60, the READ command originating from an external device such as a disk drive. The memory control devices 48a–e receive the request and retrieve the data from the corresponding memory cartridge 42a–e. The data is then passed from the memory sub-system 40 to the host controller 58. As described above, single-bit errors may either be corrected in the memory control devices 48a–e or the detection and correction devices 62a–e. The RAID memory engine 64 will correct the multi-bit errors, as described above. The corrected data will be delivered from the host controller 58 to the requesting controller or I/O device via an OUTPUT 68.

It should be evident from the discussion above, that performing error detection and correction on data residing in the memory sub-system 40 by relying on READ operations sent from peripheral devices will only result in detection of errors on those devices from which data is read. By relying on the READ command from a peripheral device, certain areas of memory may sit idle for extended periods thereby allowing data errors to accumulate undetected. To address this issue, an additional piece of logic may reside in the memory sub-system 40. The verify logic 70 initiates a routine based on an operator instruction, a pre-determined periodic instruction, or some sequence of events such as a hot-plug event, for example. The verify logic 70 initiates a check of the specified memory location in the memory sub-system 40 without depending on normal READ accesses by external devices.

The verify logic 70 initiates a verify procedure through an arbiter 72 in the host controller 58. The arbiter 72 is generally responsible for prioritizing accesses to the memory sub-system 40. A queue comprises a plurality of requests such as memory READ, memory WRITE, memory verify, and memory scrubs (discussed further below), for example. The arbiter 72 prioritizes the requests and otherwise manages the queue. The verify logic 70 essentially initiates its own internal READ command to check specified regions of the memory sub-system 40. Once the verify logic 70 initiates a request to the arbiter 72, the verify procedure is scheduled in the queue. The request will pass through the READ/WRITE control logic 66 and to the memory sub-system 40. The specified memory locations in the memory sub-system 40 will be read and any errors will be detected and/or corrected by the means described above with reference to the READ command issued by a peripheral device. The verify procedure implemented by the verify logic 70 can be initiated in a variety of ways. For instance, a user may be able to check specified memory locations by pulling up a window on an operating system. The window may allow a user to specify what locations in memory the user would like checked. By providing a user with the ability to check specified memory locations, the verify procedure provides user confidence in the validity of data stored in the memory sub-system 40.

Alternately, the verify procedure may be a periodically scheduled event. In this instance, the verify logic 70 may include a timer and a buffer for storing a list of each address location in the memory sub-system 40. At programmed or specified time intervals, the verify logic 70 may initiate READ commands to the arbiter 72 to verify the data stored in the corresponding address locations in the memory sub-system 40. The verify logic 70 may initiate READ commands through successive addresses in the memory sub-system 40 such that every memory address is eventually checked. The verify logic 70 thus may insure that all address locations in the memory sub-system 40 or a specified set of address locations are periodically checked for validity. Furthermore, the READ command issued by the verify logic 70 may be scheduled as a low priority thread in the arbiter 72 to minimize system impact. In this way, the verify procedure may only be run during periods of low system activity (e.g. when the queue in the arbiter 72 does not include READ/WRITE requests from external devices).

Yet another implementation of the verify logic 70 includes a verify operation to validate a memory cartridge when the memory sub-system 40 is switching from a non-redundant mode of operation to a redundant mode of operation (i.e. during a hot-plug event). For example, referring back to FIG. 5, the memory cartridges 42b–e are currently connected to the memory system board 50. Assuming that the memory system board 50 is operably coupled to a host system including a host controller 58 (as illustrated in FIG. 6), the memory sub-system 40 is operating in a non-redundant mode since there is no additional memory cartridge 42a to be used for parity. If a memory cartridge 42a is installed into the memory sub-system 40, it may be advantageous to verify the memory devices 46 residing on the memory cartridge 42a. The verify logic 70 can be implemented to check each address location on the memory devices 46 on the memory cartridge 42a before the system transitions to a redundant mode of operation.

First, the verify logic 70 initializes the memory cartridge 42a by writing zeros to each address location in the memory cartridge 42a. The verify logic 70 schedules the initialization WRITEs through the arbiter 70. Next, the verify logic 70 rebuilds the memory cartridge 42a by using the techniques described in FIGS. 3 and 4 to recreate the parity data that should be stored in the memory cartridge 42a. As previously described, each cache line of data from the memory cartridges 42b–e are used to recreate the parity cache line by using the XOR module in the RAID memory engine 64. Each recreated cache line is then written to the corresponding location in the memory cartridge 42a. Finally, once the data in the memory cartridge 42a is rebuilt, the verify logic 70 may initiate a READ to insure that the data that should have been written to the memory cartridge 42a was in fact stored there. This procedure can be performed by again using the data stored in the memory cartridges 42b–e to again recreate the data that should be stored in the memory cartridge 42a, and then by comparing those values to the values that were stored in the memory cartridge 42a during the rebuild procedure. If the data does not match an error message may be provided to a user indicating that a DIMM on the memory cartridge 42a may be bad. If there are no errors found in the new memory cartridge 42a, the system may switch from a non-redundant mode of operation to a redundant mode of operation.

To this point, error detection via peripheral READ commands and READ commands implemented by the verify logic 70 have been discussed. The memory control devices 48a–e, the error detection and correction devices 62a–e and the RAID memory engine 64 can be used to correct the data before it is written to the output 68. However, at this point the data residing in the memory sub-system 40 may still be corrupted. To rectify this problem, the data in the memory sub-system 40 may be overwritten or "scrubbed." For every data word in which a single bit error is detected and flagged by the memory control devices 48a–e or the error detection and correction devices 62a–e, a request is sent to the scrubbing control logic 74 indicating that the corresponding memory location should be scrubbed during a subsequent WRITE operation initiated by the scrubbing control logic 74. Similarly, if a multi-bit error is detected by the error detection and correction devices 62a–e, the data is corrected through the RAID memory engine 64, and the scrubbing control logic 74 is notified by the corresponding error detection and correction device 62a–e that the corresponding memory location in the memory sub-system 40 should be scrubbed. If a single-bit error is detected in one of the memory control devices 48a–e, or a multi-bit error is detected in one of the error detection and correction devices 62a–e a message is sent to the scrubbing control logic 74 indicating that an erroneous data word has been detected. At this time, the corrected data word and corresponding address location are sent from the RAID memory engine 64 to a buffer 76 which is associated with the scrubbing process. The buffer 76 is used to store the corrected data and corresponding address location temporarily until such time that the scrubbing process can be implemented. Once the scrubbing control logic 74 receives an indicator that a corrupted data word has been detected and should be corrected in the memory sub-system 40, a request is sent to the arbiter 72 which schedules and facilitates all accesses to the memory sub-system 40. To insure proper timing and data control, each time a data word is rewritten back to the memory sub-system 40, an entire cache line may be rewritten into each of the corresponding memory cartridges 42a–e in the subsystem 40 rather than just rewriting the erroneous data word. The scrubbing logic can be used to rewrite the locations in the memory sub-system 40 when errors are found during a typical READ operation or a verify procedure initiated by the verify logic 70.

Further, the host controller 58 may include a content addressable memory (CAM) controller 78. The CAM controller 78 provides a means of insuring that memory WRITEs are only performed when necessary. Because many READ and WRITE requests are active at any given time on the memory network bus 60 and because a scrubbing operation to correct corrupted data may be scheduled after a WRITE to the same memory location, the CAM controller 78 will compare all outstanding WRITE requests to subsequent memory scrub requests which are currently scheduled in the queue. It is possible that a corrupted memory location in the memory sub-system 40 which has a data scrub request waiting in the queue may be overwritten with new data prior to the scrubbing operation to correct the old data previously present in the memory sub-system 40. In this case, the CAM controller 78 will recognize that new data has been written to the address location in the memory sub-system 40 by implementing a simple compare function between the addresses and will cancel the scheduled scrubbing operation. The CAM controller 78 will insure that the old corrected data does not over-write new data which has been stored in the corresponding address location in the memory sub-system 40.

It should be noted that the error detection and scrubbing technique described herein may not distinguish between soft and hard errors. While corrected data may still be distributed through the output of the host controller 58, if the errors are hard errors, the scrubbing operation to correct the erroneous data words in the memory sub-system 40 will be unsuccessful. To solve this problem, software in the host controller 58, indicated in FIG. 6 by reference numeral 80, may track the number of data errors associated with a particular data word or memory location. After some pre-determined number of repeated errors are detected in the same data word or memory location, the host controller 58 may send an error message to a user or illuminate an LED corresponding to the device in which the repeat error is detected.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of tracking errors in a memory system comprising the acts of:
    detecting an error in a semiconductor memory segment;
    determining an error type, the error type being one of a soft error and a hard error;
    tracking the number of hard errors detected in the memory segment; and
    indicating that a pre-determined number of hard errors has been reached.

2. The method of tracking errors, as set forth in claim 1, wherein the act of detecting an error comprises the act of detecting an error using an ECC algorithm.

3. The method of tracking errors, as set forth in claim 1, wherein the act of detecting an error comprises the act of detecting an error in a dual inline memory module (DIMM).

4. The method of tracking errors, as set forth in claim 1, wherein the act of detecting an error comprises the act of detecting an error during execution of a READ request.

5. The method of tracking errors, as set forth in claim 1, wherein the act of detecting an error type comprises the acts of:
    writing corrected data to a memory segment address corresponding to the error;
    reading the corrected data from the memory segment address corresponding to the error; and
    performing error detection on the corrected data read from the memory segment address corresponding to the error, wherein if a second error is detected, defining the error as a hard error.

6. The method of tracking errors, as set forth in claim 1, wherein the act of tracking comprises the act of incrementing a counter each time a hard error is detected.

7. The method of tracking errors, as set forth in claim 1, wherein the act of indicating comprises the act of illuminating a light emitting diode (LED).

8. The method of tracking errors, as set forth in claim 1, wherein the act of indicating comprises the act of indicating that the pre-determined number of hard errors has been reached, the pre-determined number corresponding to an indication that the memory segment having the hard errors should be replaced.

9. The method of tracking errors, as set forth in claim 1, comprising the act of selecting the pre-determined number, wherein the pre-determined number corresponds to a user-selectable maximum number of hard errors corresponding to an indication that the memory segment having the hard errors should be replaced.

10. An error detection system comprising:
a plurality of semiconductor memory segments;
a plurality of memory controllers, wherein each of the memory controllers is operably coupled to a corresponding one of the plurality of memory segments and configured to initiate requests to the respective memory segment;
error detection logic configured to detect errors during execution of a first READ request, wherein the errors comprise one of a soft error and a hard error in the plurality of memory segments; and
a tracking device configured to track only when a hard error is detected.

11. The error detection system, as set forth in claim 10, wherein each of the plurality of memory segments comprises a dual inline memory module (DIMM).

12. The error detection system, as set forth in claim 11, comprising a light emitting diode (LED) corresponding to each of the dual inline memory modules (DIMMs), wherein each of the LEDs is configured to illuminate in response to the tracking device reaching a pre-determined number N of hard errors for the respective DIMM.

13. The error detection system, as set forth in claim 12, wherein the pre-determined number N is user-programmable.

14. The error detection system, as set forth in claim 10, wherein each of the plurality of memory controllers is configured to initiate a WRITE request in response to an error being detected, the WRITE request being initiated to write corrected data to an address corresponding to the detected error.

15. The error detection system, as set forth in claim 14, wherein each of the plurality of memory controllers is configured to initiate a second READ request after the WRITE request, the READ request being initiated to read the corrected data.

16. The error detection system, as set forth in claim 15, wherein the error detection logic is configured to detect errors during execution of the second READ request.

17. The error detection system, as set forth in claim 16, wherein the tracking device is configured to count when an error is detected in the data corresponding to the second READ request.

18. The error detection system, as set forth in claim 10, wherein each of the plurality of memory controllers comprises the error detection logic.

19. A method of manufacturing a memory system, comprising the acts of:
providing a device to detect hard errors in the memory system;
providing a device to track the number of hard errors detected in the memory system; and
providing an indication device to indicate that a pre-determined number of hard errors have been tracked.

20. The method of manufacturing, as set forth in claim 19, comprising the acts of:
providing a plurality of memory segments; and
providing a plurality of memory controllers, each of the plurality of memory controllers corresponding to one of the plurality of memory segments, and wherein each of the plurality of memory controllers is configured to provide access to the memory segments.

21. The method of manufacturing, as set forth in claim 20, wherein the act of providing a device to track the number of hard errors detected comprises the act of providing a tracking device configured to increment by one each time a hard error is detected.

22. The method of manufacturing, as set forth in claim 20, comprising providing a configuration register configured to store the pre-determined number of errors, the pre-determined number of errors corresponding to a maximum number of errors that may be detected without indicating a memory segment error.

23. The method of manufacturing, as set forth in claim 20, wherein the act of providing an indication device to indicate that a pre-determined number of hard errors comprises the act of providing a light emitting diode (LED) corresponding to each of the plurality of memory segments and configured to illuminate when the pre-determined number of errors has been detected.

24. The method of manufacturing, as set forth in claim 19, wherein the act of providing a device to detect hard errors comprises the act of providing a device comprising an ECC algorithm.

25. The method of manufacturing, as set forth in claim 19, wherein the act of providing a device to detect hard errors comprises the act of providing a memory controller comprising and ECC algorithm.

* * * * *